United States Patent
Naiki

(10) Patent No.: US 6,354,366 B1
(45) Date of Patent: Mar. 12, 2002

(54) COOLING SYSTEM USING A SEMICONDUCTOR IC DEVICE

(75) Inventor: Takashi Naiki, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 09/374,674

(22) Filed: Aug. 16, 1999

(30) Foreign Application Priority Data

Aug. 21, 1998 (JP) ............................................ 10-235497

(51) Int. Cl.$^7$ .............................. E28F 7/00; H05K 7/20
(52) U.S. Cl. ........................ 165/80.3; 361/695; 417/42; 454/184
(58) Field of Search ........................ 236/49.3; 165/80.3, 165/183; 62/259.2; 361/695; 417/42; 454/184

(56) References Cited

U.S. PATENT DOCUMENTS 6,000,623 A * 12/1999 Blatti et al. ................. 236/49.3
6,082,623 A * 7/2000 Chang .................... 165/80.3 X

* cited by examiner

Primary Examiner—William Wayner
(74) Attorney, Agent, or Firm—Beyer Weaver & Thomas LLP

(57) ABSTRACT

A cooling system incorporates a semiconductor IC device having an abnormality detector for detecting the occurrence of an abnormal condition by receiving clock signals and more or less periodically outputted signals from a system being monitored. An AND gate receives the clock signals and generates sequentially increasing count signals. During a normal operation of the system, another AND gate receives the signals from the system being monitored. These signals serve to initialize the clock count signals. These signals are received under a normal condition of operation such that the count signal is initialized before reaching a specified value. An abnormality-indicating signal is outputted when the clock count number reaches the specified value. The AND gates are so connected that the first AND gate serves to prohibit input of clock signals, the second AND gate serves to stop initialization of the count signal when an abnormality indicating signal is received. The mode of operation of the system may be changed so as to reduce the rate of heat production when an abnormal condition is detected.

6 Claims, 1 Drawing Sheet

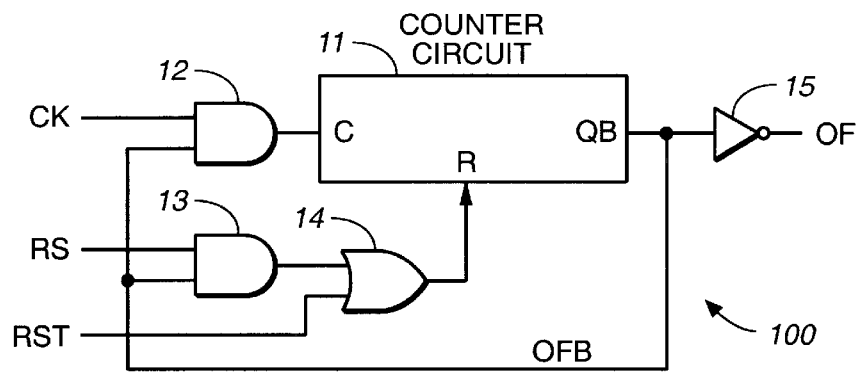
FIG._1
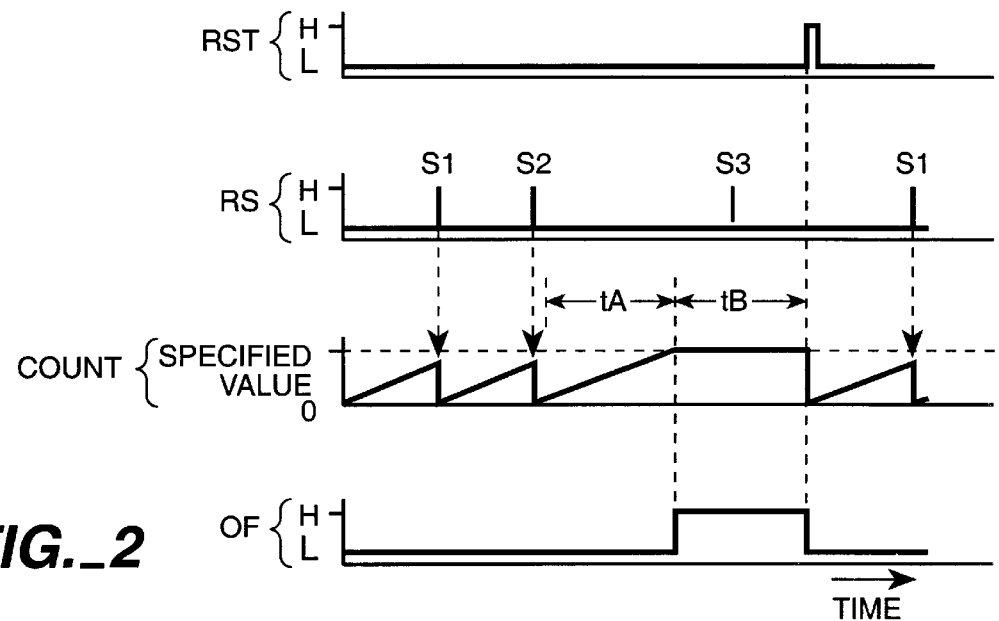
FIG._2
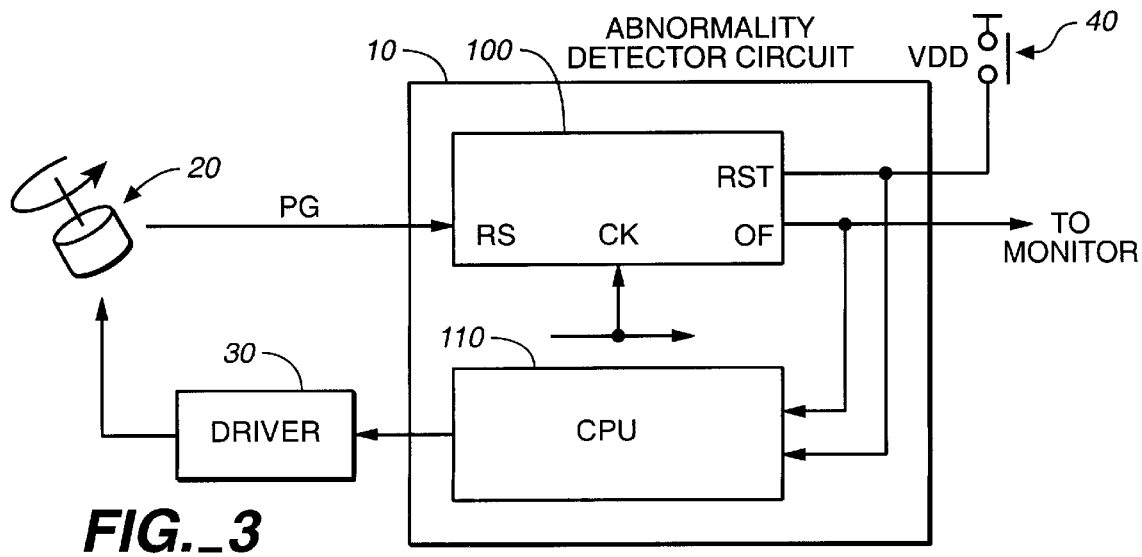
FIG._3

COOLING SYSTEM USING A SEMICONDUCTOR IC DEVICE

BACKGROUND OF THE INVENTION

This invention relates to a cooling system using a semiconductor integrated circuit (IC) device and more particularly to a semiconductor IC device incorporating an abnormality detector for detecting an abnormal condition by using a monitoring signal generated during a system operation.

It sometimes happens that a semiconductor IC device such as a one-chip microcomputer or a DSP behaves abnormally, failing to function according to a prescribed program due, for example, to the noise generated by static electricity. In order to effectively prevent such an abnormal situation, it has been known, as disclosed in Japanese Patent Publication Tokkai 6-110737, to use a monitoring circuit, called a watchdog timer circuit, to detect a runaway situation and to initialize the semiconductor IC device.

A watchdog timer circuit comprises a counter circuit for counting clock signals and serves to reset the counter circuit at a specified timing according to a program when it is functioning normally so as to prevent the counter circuit from overflowing. Under an abnormal or runaway situation, however, the device is not functioning according to a prescribed program and hence the counter circuit may not be reset at an intended timing. Thus, the abnormal or runaway situation may be stopped if the device is initialized by using the signal outputted at the time of such an overflow, and the device can be restored to its normal operating condition.

Although such a prior art method of using a watchdog timer circuit is very effective in the case of a runaway due to an incidental cause, it has not been effective in the case of a constant abnormality of a kind which will cause an erratic behavior even after the semiconductor IC device has been initialized. Moreover, since the user often does not recognize an abnormal condition, such an abnormal condition could cause the destruction of the semiconductor IC device or any apparatus which incorporates it.

One of the examples of abnormality of this kind is due to the heat produced by an apparatus. In an apparatus such as a computer system or a power-supplying system, a semiconductor IC device such as a CPU or a power transistor used within the apparatus generates a significant amount of heat due to the expended power. Thus, without any affirmative effort to cool such a heat-generating semiconductor IC device, it may reach a high temperature beyond its allowable temperature range within which it can be expected to function normally. In order to prevent the occurrence of such a thermal runaway, a cooling device such as an air-cooling fan is used to forcibly cool the semiconductor IC device but if such a cooling device fails to function normally for whatever cause, the temperature of the semiconductor IC device rises gradually, eventually causing a situation of thermal runaway.

With a prior method of using an overflow signal from a watchdog timer circuit, however, a situation of thermal runaway as described above is in most situations not noticed by the user, and the user would fail to investigate or eliminate its cause. Thus, the thermal runaway will start again because the return to the normal condition is only of a temporary nature. If this condition persists, the semiconductor IC device will remain at a high temperature for an extended period of time and, in a worst case, may eventually be destroyed. Even if the user happens to notice an abnormal condition from the behavior of the apparatus, furthermore, the user will not be able to ascertain the situation or to investigate its cause because the semiconductor IC device is automatically initialized after the watchdog timer circuit overflows.

SUMMARY OF THE INVENTION

It is therefore an object of this invention to provide a cooling system incorporating an improved semiconductor IC device such that an abnormal condition in the semiconductor IC device of an apparatus using it can be easily detected and that the abnormal condition can be quickly eliminated to prevent the destruction of the apparatus.

A cooling system embodying this invention, with which the above and other objects can be accomplished, may be characterized as incorporating a semiconductor IC device having an abnormality detector for detecting the occurrence of an abnormal condition by receiving clock signals and what is herein referred to as monitoring signals which are outputted intermittently or more or less periodically from a system being monitored. A first gate circuit, or an AND gate, receives the clock signals and generates signals (herein referred to as the count signals) each indicative of a sequentially increasing number, depending on the number of received clock signals or the elapsed time. During a normal operation of the system being monitored, a second gate circuit (or another AND gate) receives the monitoring signals outputted intermittently from the system being monitored. These monitoring signals serve to initialize the increasing counted number. These monitoring signals are received under a normal condition of operation such that the counted number is initialized before reaching a specified value. There is also provided a counter for outputting an abnormality-indicating signal when the counted number reaches the aforementioned specified value. These gate circuits and the counter are so connected that the first gate circuit serves to prohibit input of clock signals, the second gate circuit serves to stop initialization of the counted number when an abnormality-indicating signal is received. With a device thus structured, the output of monitoring signals is not stopped when there is an abnormal condition.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a schematic block diagram of an example of abnormality detector circuit embodying this invention;

FIG. 2 is a timing chart for the operation of the abnormality detector circuit of FIG. 1; and FIG. 3 is a block diagram of a system using a semiconductor IC device incorporating the abnormality detector circuit of FIG. 1.

Throughout herein, like or equivalent components are indicated by the same numerals and may not necessarily be described repetitiously for simplifying the disclosure.

DETAILED DESCRIPTION OF THE INVENTION

The invention is described next by way of an example with reference to FIGS. 1, 2 and 3. FIG. 1 shows the structure of an abnormality detector circuit 100 for a semiconductor IC device as an example of abnormality detecting means which may be used according to this invention, including a binary counter circuit 11 adapted to output a signal (the "OFB signal") from its QB terminal when the number counted thereby reaches a preliminarily specified value, an AND circuit 12 (also referred to as the "first gate circuit") and an OR circuit 14 each with an output terminal connected respectively to the clock input terminal C and the reset input terminal R of the counter circuit 11, an inverter circuit 15 with an input terminal connected to the output terminal QB of the counter circuit 11 and another AND circuit 13 (also referred to as the "second gate circuit") with its output terminal connected to one of the input terminals of the OR circuit 14. The counter circuit 11 is also so adapted as to become initialized and to count "0" when a highlevel signal "H" is inputted to its reset terminal R.

Clock signals CK, serving as the performance clock for the semiconductor IC device, are received by the AND circuit 12 through one of its input terminals. Monitoring signals RS which are generated more or less periodically according to the operation of a system (not shown) are received by the other AND circuit 13 through one of its input terminals. A reset signal RST transmitted from outside for initializing the semiconductor IC device is received by the OR circuit 14 through one of its input terminals. The aforementioned QB terminal of the counter circuit 11 is connected to the other of the input terminals of each of the AND circuits 12 and 13. The inverter 15 outputs OF signals through its output terminal to another circuit or circuits outside.

Operations of the abnormality detector circuit 100 is explained next with reference to FIG. 2 wherein the period indicated by tA represents an "abnormal period" during which the monitoring signals RS fail to be inputted due to an abnormality, the "specified number" indicates the value of the counted number at which the OFB and OF signals are inverted, and the period indicated by tB is the period during which the operations of the abnormality detector circuit 100 is stopped because of the detection of this abnormal condition. Outside the periods indicated by tA and tB, the abnormality detector circuit 100 is operating normally, receiving monitoring signals RS (S1, S2, etc.) more or less periodically and thereby resetting the counter circuit 11 and initializing its counted number to "0" before it reaches the "specified number".

Within the abnormal period tA, monitoring signals RS which should continue to be generated during normal operations of the system are no longer received. As a result, the counter circuit 11 is not reset and the number counted thereby does not return to "0", eventually reaching the specified number and thereby causing the OF signal to become "H". Since the OFB signal is "L" in the meantime, input of the clock signals CK and the reset signals RS is prevented by the AND circuits 12 and 13 and the OF signals remain to be "H". In other words, even if a monitoring signal is received during this period (tB) as shown at S3, the counter circuit 11 is not initialized thereby.

Thus, the user monitors the OF signals from the inverter circuit 15 by whatever means. It may be arranged so as to control the operations of the semiconductor IC device according to the OF signal because not only is it possible for the user to be alerted of the occurrence of an abnormal situation but also the continued operation of the apparatus in the abnormal condition can be automatically prevented. Moreover, since the semiconductor IC device is not automatically initialized, the user can investigate the conditions of the terminals, for example, to determine the nature and the cause of the abnormality, and to eliminate the cause. After the cause of the abnormal condition is removed, the user can carry out an external operation to input a reset signal RST to initialize the counter circuit 11, restoring the normal condition of operations of the system.

As an example of way of using a semiconductor IC device embodying this invention, FIG. 3 shows the structure of a cooling system of an air-cooling type for an apparatus such as a personal computer. In FIG. 3, numeral 10 indicates a semiconductor IC device embodying this invention, numeral 100 again indicates the abnormality detector circuit shown in FIG. 1, numeral 20 indicates a motor for a fan for cooling the semiconductor IC device 10 itself or any other similar device, numeral 30 indicates a driver device for controlling the operation of the fan 20 according to signals outputted according to a program from a CPU 110 within the semiconductor IC device 10, and numeral 40 indicates a switching circuit for forcibly initialize the semiconductor IC device 10 from outside.

Signals PG indicative of the rotary motion of the fan motor 20 and the clock signals CK for the semiconductor IC device 10 are received by the abnormality detector circuit 100. Signals from the switching circuit 40 are inputted both to the abnormality detector circuit 100 and to the CPU 110. The OF signal outputted from the abnormality detector circuit 100 is transmitted both to a monitoring device (not shown) provided externally to the semiconductor IC device 10 and to the CPU 110.

Under a normal operating condition, the numbers counted by the abnormality detector circuit 100 are more or less periodically initialized by the PG signals received from the fan motor 20 such that the OF signal is not outputted. When an abnormal situation occurs such that the fan motor 20 cannot rotate for whatever reason, the input of the PG signals is stopped, and since the numbers counted by the abnormality detector circuit 100 are not reset, the counting continues and the OF signal eventually becomes "H". As soon as the OF signal becomes "H", the CPU 110 understands that an abnormal situation has occurred with the fan motor 20 and thereby undertakes to stop the transmission of signals to the driver device 30 to stop the operation of the fan motor 20 and to change the frequency of the clock signals such that the rate of heat production will decrease and cooling will not become necessary. On the other hand, the user is alerted through the monitoring device (not shown) and may proceed to store various necessary data and to investigate the cause of the abnormal condition. Since the semiconductor IC device 10 is not automatically initialized, the user can ascertain easily from the conditions of the terminals, for example, that the PG signals are not being received and whether the fan motor 20 has stopped due to a simple cause such as an object which has been stuck. After the cause of the abnormal condition has been removed, the user will input a reset signal to the semiconductor IC device 10 through the switching circuit 40 to thereby initialize the counter circuit 11 and the semiconductor IC device 10 such that a normal operation can be resumed.

Although the invention has been described above by way of only one example, this example is not intended to limit the scope of the invention. The counter circuit 11 of the semiconductor IC device 100 of FIG. 1, for example, may be replaced by a charge-and-discharge circuit such that the control can be effected by its changing voltage level. Each of the gate circuits may likewise be replaced by a device of a different structure. In the system shown in FIG. 3, the abnormality detector circuit 100 of this invention may be used in combination with a prior art watchdog timer circuit. Moreover, the switching circuit 40 may be dispensed with and a power-on-reset circuit or the like may be used instead for a return to a normal operation. For alerting the user, use may be made of a buzzer, an LED, a rotary signal from a generator or a manual signal.

What is claimed is:

1. A cooling system comprising:

a device which generates heat when in operation;

a fan for cooling said device; and a motor for said fan, said motor outputting motion-indicating signals indicative of rotary motion of said motor;

wherein said device detects an abnormal condition by monitoring whether or not said signals are being outputted periodically and changes into an operating mode in which said device generates less heat if an abnormal condition is detected thereby.

2. The cooling system of claim 1 wherein said device is a semiconductor IC device.

3. A cooling system comprising:

a device which generates heat when in operation;

a fan for cooling said device; and a motor for said fan, said motor outputting motion-indicating signals indicative of rotary motion of said motor;

wherein said device detects an abnormal condition by monitoring whether or not said signals are being outputted periodically and changes into an operating mode in which said device generates less heat if an abnormal condition is detected thereby; and wherein said device comprises a first gate circuit, a second gate circuit and a counter;

said first gate receiving clock signals periodically and transmitting count signals correspondingly to said counter for sequentially increasing a clock count number;

said second gate circuit receiving said motion-indicating signals outputted from said motor and transmitting to said counter an initialization signal whenever one of said motion-indicating signals is received;

said counter outputting an abnormality-indicating signal when said clock count number reaches a specified value, said counter initializing said clock count number whenever said initialization signal is received, said motion-indicating signals being received under a normal condition of operation of said monitored system such that said clock count number is initialized before reaching said specified value;

said abnormality-indicating signal serving to prevent said first gate from transmitting said count signals and said second gate from transmitting said initialization signal to said counter.

4. The cooling system of claim 3 wherein said first gate circuit and said second gate circuit are each an AND gate circuit.

5. The cooling system of claim 4 wherein said first gate circuit has one input terminal through which said clock signals are received, another input terminal through which said abnormality-indicating signal is received and an output terminal which is connected to said counter and through which said count signals are transmitted to said counter, and wherein said second gate circuit has one input terminal through which said monitoring signals are received, another input terminal through which said abnormality-indicating signal is received and an output terminal which is connected to said counter and through which a reset signal for initializing said clock count number is transmitted under said normal operation.

6. The cooling system of claim 5 further comprising an OR gate circuit connected between said second gate circuit and said counter, said OR gate circuit having one input terminal connected to said second gate circuit, another input terminal for receiving a reset signal therethrough for initializing said clock count number and an output terminal connected to said counter.

* * * * *